United States Patent [19]

Shimazaki et al.

[11] Patent Number: 5,119,243
[45] Date of Patent: Jun. 2, 1992

[54] DIGITAL SIGNAL MAGNETIC RECORDING/REPRODUCING APPARATUS

[75] Inventors: Hiroaki Shimazaki, Moriguchi; Toyohiko Matsuta, Neyagawa; Etsuto Nakatsu, Neyagawa; Masafumi Shimotashiro, Neyagawa; Masaaki Kobayashi, Kawanishi, all of Japan

[73] Assignee: Matsushita Electric Industrial Co., Ltd., Osaka, Japan

[21] Appl. No.: 452,380

[22] Filed: Dec. 19, 1989

[30] Foreign Application Priority Data

Dec. 19, 1988 [JP] Japan ............... 63-321017

[51] Int. Cl.$^5$ ............... G11B 5/09
[52] U.S. Cl. ............... 360/46; 360/30
[58] Field of Search ............... 360/29, 30, 32, 51, 360/46

[56] References Cited

U.S. PATENT DOCUMENTS 4,470,080  9/1984  Kimura ............... 360/30
4,547,817 10/1985  Klaassen ............... 360/30

OTHER PUBLICATIONS

"A Study of High Efficiency Channel Coding for Digital VCR", T. Matsuta et al., IEICE 1988 Spring National Convention Record, part C-2, 2-59, Mar. 28-31, 1988, Tokyo.
"Digital Microwave Communication", M. Kuwahara et al., Kikaku center, 133, May, 1984.
"Digital VTR Using Bias Recording and Coded Modulation", M. Shimotashiro et al., 1988.

Primary Examiner—Vincent P. Canney
Attorney, Agent, or Firm—Wenderoth, Lind & Ponack

[57] ABSTRACT

A digital signal magnetic recording/reproducing apparatus modulates a digital signal with a carrier and performs recording/reproducing of the modulated signal. The carrier frequency is made equal to the clock frequency multiplied by a factor (N/M), where N and M are integers. The carrier and clock are reproduced using only one phase locked loop. When the carrier-modulated signal is recorded/reproduced using a magnetic recording medium, the phase of the modulated signal is shifted relative to the phase of the carrier. Shifting the clock phase before using the clock for decoding the demodulated signal prevents a degradation of error rate. By periodically inserting a clock phase reference signal in the recording signal, accuracy of adjustment of clock phase is improved.

18 Claims, 10 Drawing Sheets

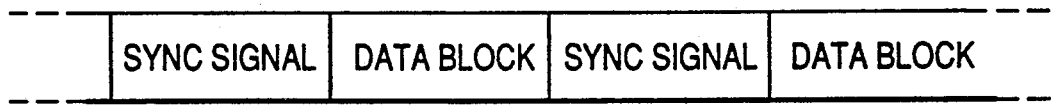
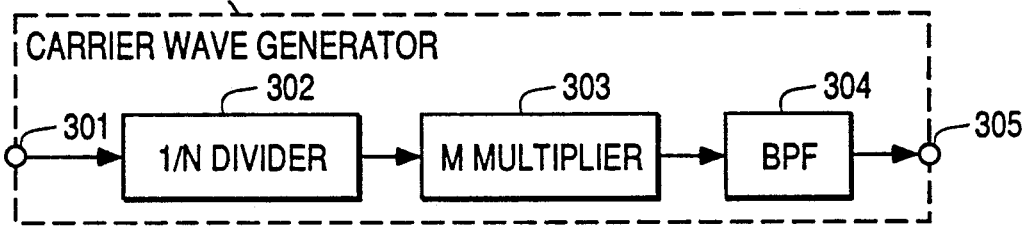
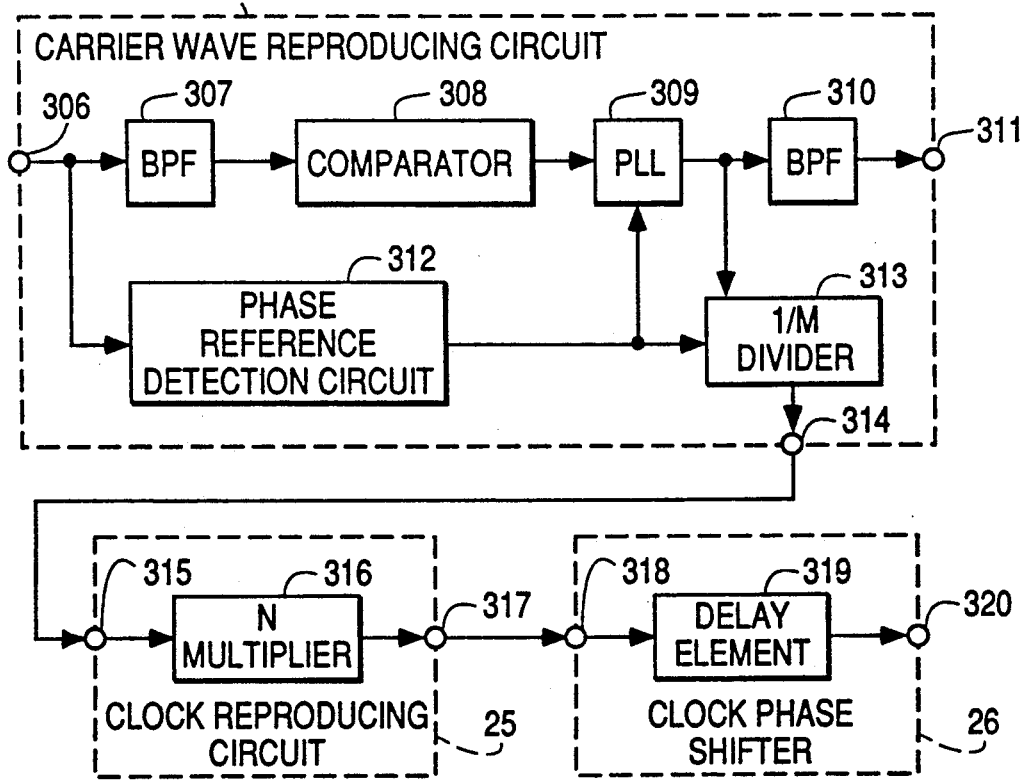

DIGITAL SIGNAL MAGNETIC RECORDING/REPRODUCING APPARATUS

BACKGROUND OF THE INVENTION

1. Field of the Invention

This invention relates to a digital signal magnetic recording/reproducing apparatus such as a digital video taperecorder (DVTR).

2. Description of the Prior Art

Various proposals which have been made in the prior art for providing a digital signal magnetic recording/reproducing apparatus utilize various forms of modulations for converting an input digital signal to a recording signal.

We have already proposed a new digital signal magnetic recording/reproducing apparatus utilizing multi-level quadrature amplitude modulation, having high utilization efficiency of frequency band and high recording rate (cf. T. Matsuta et al "A Study of High Efficiency Channel Coding for Digital VTR". IEICE (the Institute of Electronics, Information and Communication Engineers of Japan) 1988 spring national convention record, part C-2, 2-59, Mar. 28-31, 1988, Tokyo). Further, we have also proposed a new digital signal magnetic recording/reproducing apparatus utilizing multi-level quadrature amplitude modulation, having a relationship established between the frequency of an input clock signal that is synchronized with successive data values of the input digital signal and the frequency of the carrier used for modulation. This relationship has been achieved by making the carrier frequency equal to the input clock signal frequency multiplied by a factor (M/N), where N and M are positive integers (cf. M. Shimotashiro et al U.S. patent application Ser. No. 329,720 filed on Mar. 28, 1989).

In this apparatus, however, no consideration is given on the shift of the relationship between the carrier phase and the modulated signal phase caused by the magnetic recording and reproducing process, i.e., the electric-to-magnetic conversion by the recording of the electric signal on a magnetic recording medium with a magnetic recording head and the magnetic-to-electric conversion by the reproducing of the recorded signal from the magnetic recording medium with a magnetic reproducing head. In other words, the phase of the modulated signal or clock is shifted relative to the phase of the carrier when subjected to the magnetic recording and reproducing process. So, error rate of the reproduced signal is degraded.

On the other hand, in the conventional demodulating circuit of a multi-level quadrature amplitude modulated signal for a digital communication apparatus, carrier the wave and clock are reproduced separately (e.g., M. Kuwahara et al "digital microwave communication", Kikaku center, 133, May, 1984). In such a system, the demodulating circuit requires a long "lock-up" time to start reproducing the carrier wave and clock accurately.

SUMMARY OF THE INVENTION

It is an object of the present invention to provide a new digital signal magnetic recording/reproducing apparatus for reproducing a clock from a reproduced carrier wave using only one phase locked loop, thus having a short "lock-up" time, without degradation of the error rate cause by the shift of the relationship between the carrier phase and the modulated signal phase resulting from the magnetic recording and reproducing.

In order to attain the above object, a digital magnetic recording/reproducing apparatus of this invention comprises: an encoder for coding an inputted digital signal into a digital signal optimized for carrier modulation, preferrably into two-series multi-level digital signals for quadrature amplitude modulation (QAM), and for adding a synchronous signal periodically to the coded digital signal at respective timings at each of which the carrier and an input clock signal coincide with each other in phase; a carrier wave generator for generating a carrier wave which has a specific frequency in a specific relation to the frequency of the input clock; a modulator for modulating an output of the encoder using the carrier wave generated by the carrier wave generator; a magnetic recording/reproducing unit for recording an output of the modulator on a magnetic recording medium and reproducing the recorded signal; a carrier wave reproducing circuit for reproducing the carrier wave from the reproduced signal from the magnetic recording/reproducing unit and outputting carrier phase information simultaneously; a demodulator for demodulating the reproduced signal from the magnetic recording/reproducing unit by using the carrier reproduced by the carrier reproducing circuit; a clock reproducing circuit for reproducing the clock from the phase information from the carrier wave reproducing circuit; a clock phase shifter for shifting the phase of an output of the clock reproducing circuit by a delay amount caused by the magnetic recording/reproducing process; a decoder for decoding an output of the demodulator into a digital signal.

The apparatus may be provided with an encoder for adding a clock reference signal to detect an amount of phase-relation shift between the modulated signal and the carrier wave.

Preferably, the apparatus is provided with a bias circuit for adding a bias signal to the output of the modulator. An output of the bias circuit is recorded on the magnetic recording medium and reproduced.

By the above construction, the carrier wave has a frequency related to the frequency of the inputted clock and the clock is reproduced using the carrier phase information from the carrier wave reproducing circuit. This makes it easier and faster to reproduce the clock. Also, due to the clock phase shifter, there is no degradation of error rate caused by the phase-relation shift between the modulated signal and the carrier wave resulting from the magnetic recording/reproducing process.

Due to the clock reference signal, reproduction of the clock can be more optimized with respect to the magnetic recording/reproducing system.

Furthermore, due to the use of the bias recording, non-linearity in the electromagnetic conversion system can be alleviated, and deterioration of the S/N ratio by cause the distortion of the signal produced by the non-linearity of the elecromagnetic conversion system can be reduced.

BRIEF DESCRIPTION OF THE DRAWINGS

FIG. 2 is a conceptual signal format of the output signal from a synchronous addition circuit of the digital signal magnetic recording/reproducing apparatus in the first embodiment;

FIG. 3a is a block diagram of a carrier wave generator in the digital signal magnetic recording/reproducing apparatus of the present invention;

FIG. 3b is a block diagram of a carrier wave reproducing circuit, a clock reproducing circuit and a clock phase shifter in the digital signal magnetic recording/reproducing apparatus in the first embodiment;

DESCRIPTION OF THE PREFERRED EMBODIMENTS

Figure 1:
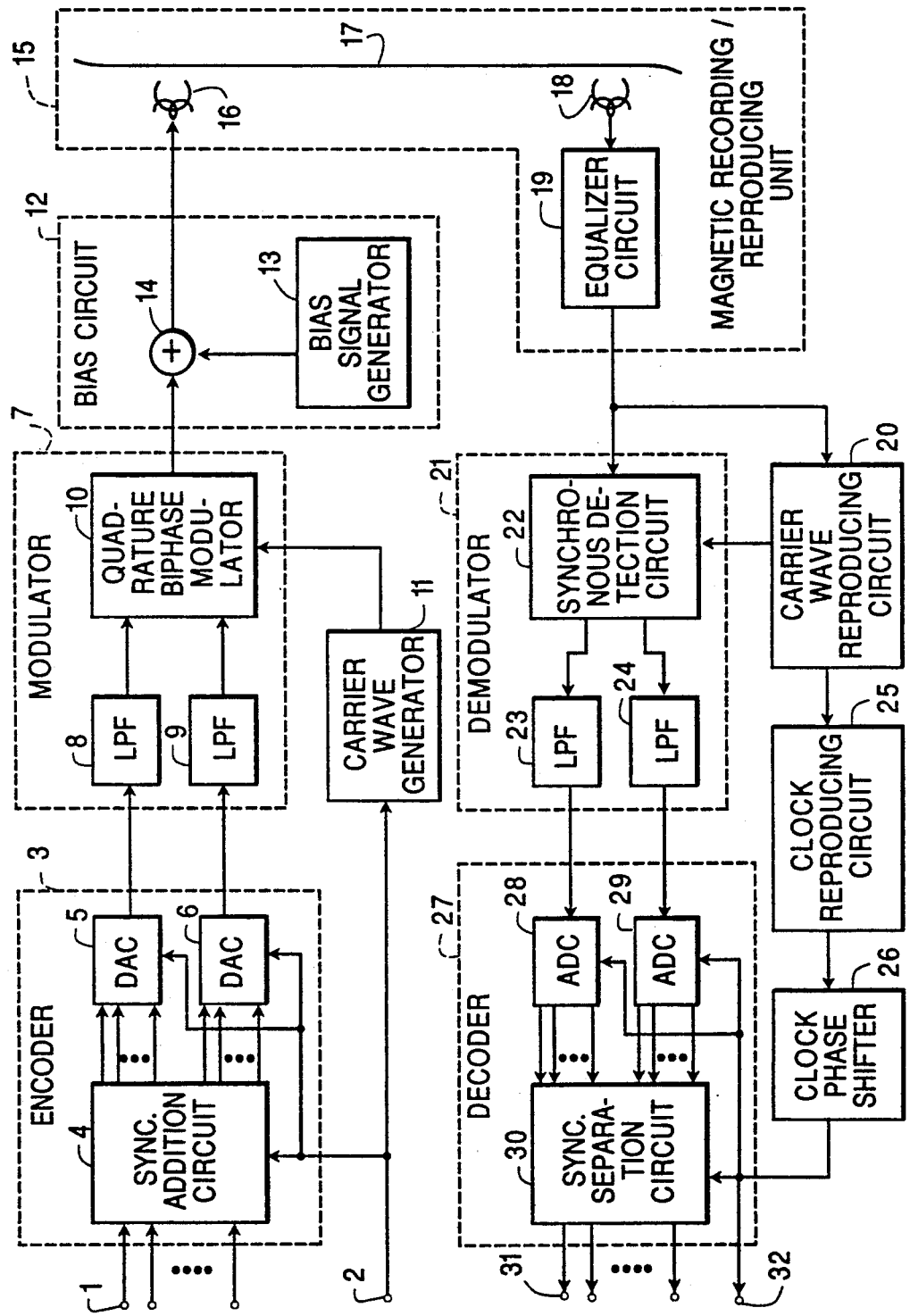
FIG. 1 is a block diagram of a digital signal magnetic recording/reproducing apparatus in the first embodiment of the present invention.

In FIG. 1 there is shown a block diagram of a digital signal magnetic recording/reproducing apparatus in the first embodiment of the present invention. A digital signal is inputted into an encoder 3 through an input terminal 1. Also, a clock synchronized with successive data values of the input digital signal is inputted into an input terminal 2.

In the encoder 3, the inputted digital signal is added with a synchronous signal periodically at each timing t which the carrier and clock signal coincide with each other in phase. Conceptual signal diagram of the output of the synchronous addition circuit 4 is shown in FIG. 2.

The digital signal added with the synchronous signal is divided into two parallel digital signals. These two parallel digital signals are applied to digital to analog converters (DACs) 5 and 6 respectively within the encoder 3, whereby each data value is converted to a bipolar pulse having one of predetermined levels. A train of such pulses will hereinafter be referred to as a multi-level digital signal. For example, assuming the input of the encoder 3 to be a 4-bit data, it is divided into two 2-bit data. Then, the two 2-bit data are inputted into DACs 5 and 6 respectively to become the multi-value digital signals each capable of having four values (2 bits).

The outputs of DACs 5 and 6 are inputted into a modulator 7. In the modulator 7, the inputted signals from DACs 5 and 6 are inputted into Low-Pass Filters (LPFs) 8 and 9 respectively to undergo band restrictions. The outputs of LPFs 8 and 9 are inputted into a quadrature biphase modulator 10 and subjected to quadrature biphase modulation using a carrier outputted from a carrier wave generator 11.

A concrete block diagram of the carrier wave generator 11 is shown in FIG. 3a. The clock signal inputted through an input terminal 301 is frequency-divided to 1/N by a frequency divider 302. The output of the frequency divider 302 is fed to a multiplier 303 and multiplied by M. The output of the multiplier 303 is applied to an output terminal 305 as a carrier wave through a band-pass filter (BPF) 304. Here, the frequency fc of the carrier wave is expressed as:

$$fc = (M/N) \cdot fclk$$

where, each of M and N is any integer and fclk is the clock signal frequency.

Figure 4A:
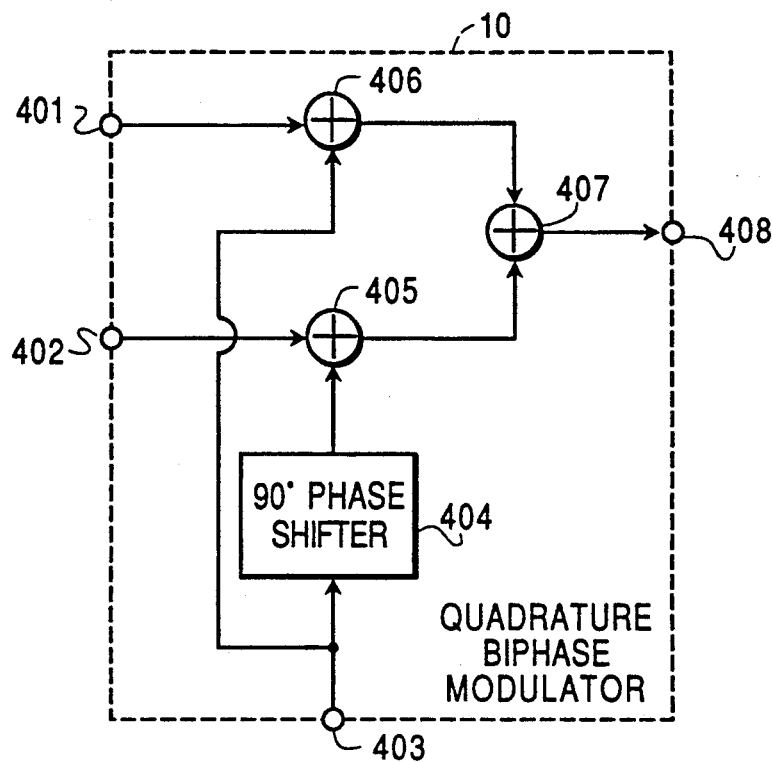
FIG. 4a is a block diagram of a quadrature biphase modulator in the digital signal magnetic recording/reproducing apparatus of the present invention.

A concrete block diagram of the quadrature biphase modulator 10 is shown in FIG. 4a. It is assumed that the output from the carrier wave generator 11 is $C(t) = A \cdot \cos(2\pi fc \cdot t)$, and the outputs of LPFs 8 and 9 are d1(t) and d2(t), respectively. The signals d1(t) and d2(t) are the multi-value digital signals each having n levels, where n is an optional integer. If the number of input bits of the encoder is 4, the outputs of LPFs 8 and 9 are 4-value digital signals each having four levels of, for example, 1.5, 0.5, −0.5 and −1.5. The outputs d1(t) and d2(t) of LPFs 8 and 9 are inputted into balanced modulators 405 and 406 through terminals 401 and 402, respectively. Further, the carrier C(t) inputted through a terminal 403 is inputted into the balanced modulator 406, and on the other hand is subjected to a 90° shift phase by a phase shifter 404 and inputted into the balanced modulator 43 as $A \cdot \sin(2\pi \cdot fc \cdot t)$. Outputs of the balanced modulators 405 and 406 are added by an adder 407. The output of the adder 407 is outputted from a terminal 408 as an output S(t) from the quadrature biphase modulator 10. That is to say, $$S(t) = d1(t) \cdot A \cdot \cos(2\pi fc \cdot t) + d2(t) \cdot A \cdot \sin(2\pi fc \cdot t)$$

Figure 5:
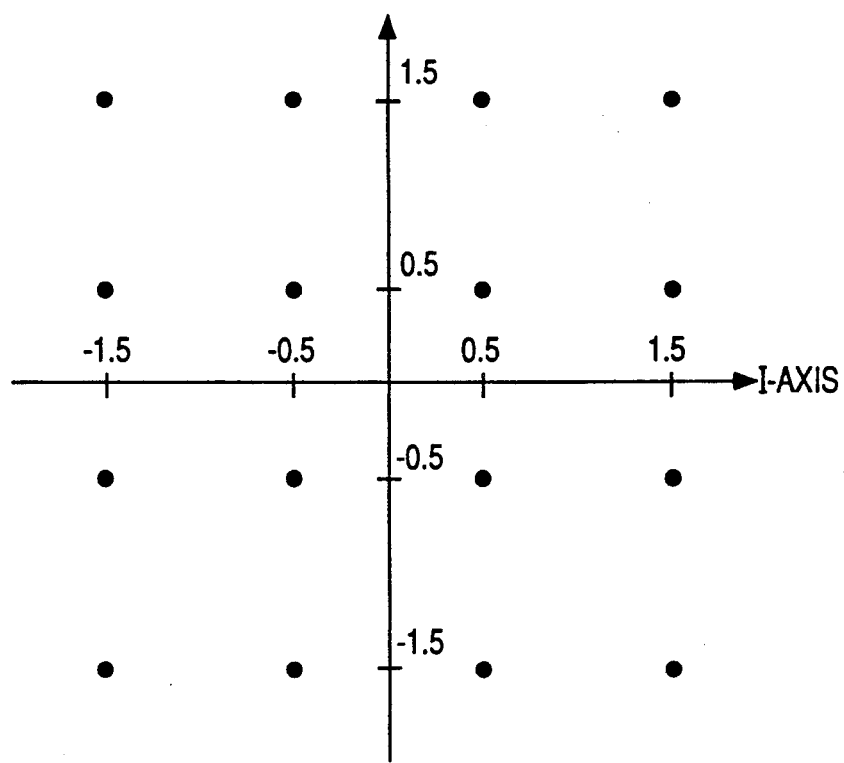
FIG. 5 is a conceptual diagram showing the quadrature amplitude modulation signal constellation in the recording signal of the digital signal magnetic recording/reproducing apparatus of the first embodiment.

The output signal from the quadrature biphase modulator 10 can be expressed by a point on the complex plane. An example in the case of the 16 quadrature amplitude modulation (hereinafter to be referred to as 16QAM) is shown in FIG. 5. The number of levels in this case is four on each of the In-phase axis which is the same in phase as the carrier (hereinafter to be I axis) and the Quadrature-phase axis which crosses at right angles with the carrier (hereinafter to be Q axis), i.e., in each of d1(t) and d2(t). The levels of the I axis and Q axis respectively take the four values of 1.5, 0.5, −0.5, and −1.5. By the combination thereof 16 signal points are generated.

The output from the quadrature biphase modulator 10 is inputted into a bias circuit 12, where it is added with a bias signal (frequency bias signal) outputted from a bias signal generator 13 by an adder 14, and the combined signal is outputted. The bias signal frequency $f_B$ is in the following relation with the maximum frequency $f_H$ in the recording signal band:

$$f_B \geq 3 \cdot f_H.$$

Figure 6:
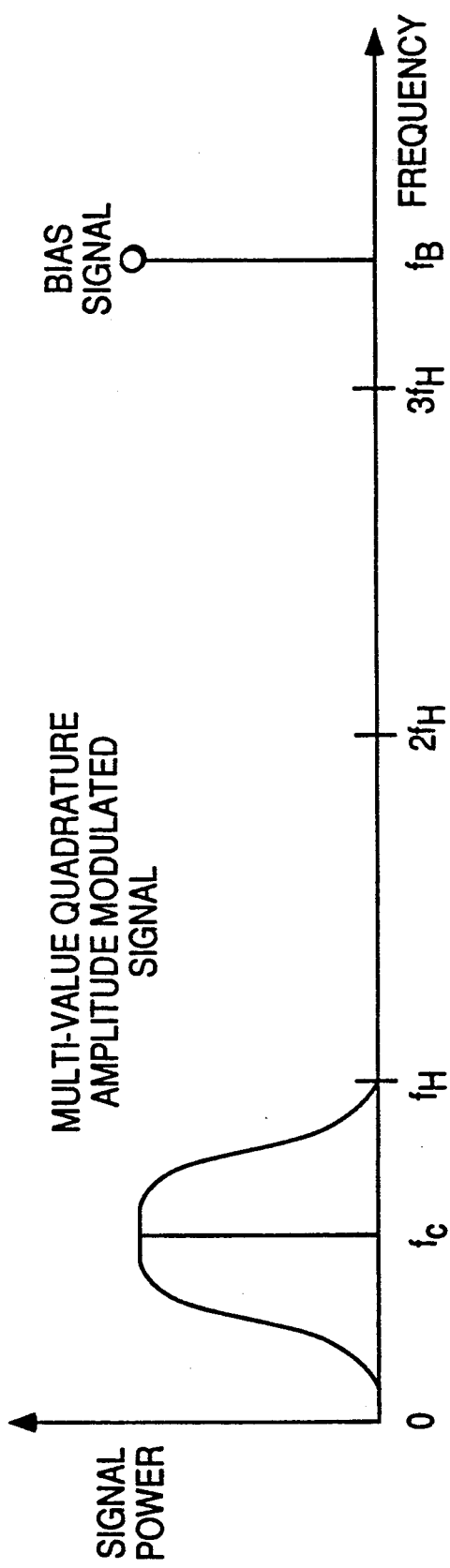
FIG. 6 is a conceptual diagram showing the frequency spectrum in recording of the digital signal magnetic recording/reproducing apparatus of the present invention.

This relation is shown in FIG. 6. By this relation, entry of the cross modulation component of $f_B - 2 \cdot f$ into the recording signal band is prevented (where, f is an optional frequency in the recording signal band). Also, the bias current is set such that the composite SN ratio of the SN ratio in the band to be used and the SN ratio by the residual distortion in the band (with the power of distortion to be taken as noise) becomes the maximum. If the bias current is enlarged, the linearity in the electromagnetic conversion system is improved, but the frequency characteristic is deteriorated to aggravate the SN ratio. Therefore, there is an optimum value for the bias current value. The output of the bias circuit 12 is inputted to a magnetic recording/reproducing unit 14 and recorded on a magnetic recording medium 17 (e.g., a magnetic tape or a magnetic disc) by a recording head 16.

The signal recorded on the magnetic recording medium 17 is picked up by a reproducing head 18 (which may be the same as the recording head) and inputted into an equalizer circuit 19. A equalizer circuit 19 enhances high frequency components of the reproduced signal to compensate for attenuation of these components in the magnetic recording/reproducing process, to thereby render a flat overall frequency response characteristic for the magnetic recording/reproducing system (i.e. consisting of the heads 16, 18 and the medium 17). The equalized reproduced signal from the equalizer is then inputted to a carrier wave reproducing circuit 20 and a demodulator 21.

The carrier wave reproducing circuit 20 reproduces the carrier wave from the output signal of the equalizer circuit 19, outputs the carrier wave to the demodulator 21, and also outputs carrier phase information into a clock reproducing circuit 25. The clock reproducing circuit reproduces the clock from the carrier phase information and outputs the clock to a clock phase shifter 26. The clock phase shifter 26 shifts the phase of an output of the clock reproducing circuit 25 by a delay amount caused by the magnetic recording/reproducing process. The clock phase shifter 26 outputs the phase-shifted clock to a decoder 27 and an output terminal 32.

A concrete block diagram of the carrier wave reproducing circuit 20, the clock reproducing circuit 25 and the clock phase shifter 26 is shown in FIG. 3b. The reproduced signal inputted through a terminal 306 is inputted into a band-pass filter (BPF) 307 and a phase reference detection circuit 312. The BPF 307 restricts the band of the reproduced signal and outputs the band-restricted signal to a comparator 308 for pulse shaping. The output of the comparator 308 is fed to a phase locked loop (PLL) 309. On the other hand, the phase reference detection circuit 312 detects the modulated synchronous signal and outputs the synchronous signal which indicates a timing at which the carrier and clock signal become the same in phase to the PLL 309 and a divider 313. The PLL 309 reproduces the carrier wave from the outputs of the comparator 308 and the phase reference detection circuit 312, and applies the thus reproduced carrier wave to a terminal 311 through a BPF 310. The output of the PLL 309 is fed also to the divider 313 and frequency divided using the output of the phase reference detection circuit 312 as a reference signal. The output of the divider 313 is fed to a clock reproducing circuit 315 through a terminal 314.

In the clock reproducing circuit 25, a frequency multiplier 316 multiplies the frequency of an output of the divider 313 through a terminal 315 by N. The output of the multiplier 316 is fed to the clock phase shifter 26 through a terminal 317, as a reproduced clock. In the clock phase shifter 26, a delay element 319 allows the reproduced clock through a terminal 318 to shift its phase by a shift amount caused by the magnetic recording/reproducing process. The output of the delay element 319 is fed to the decoder 27 through a terminal 320. As above, a carrier wave and a clock reproduced have the same relationship in frequency and phase as in the modulating process before recording.

Figure 4B:
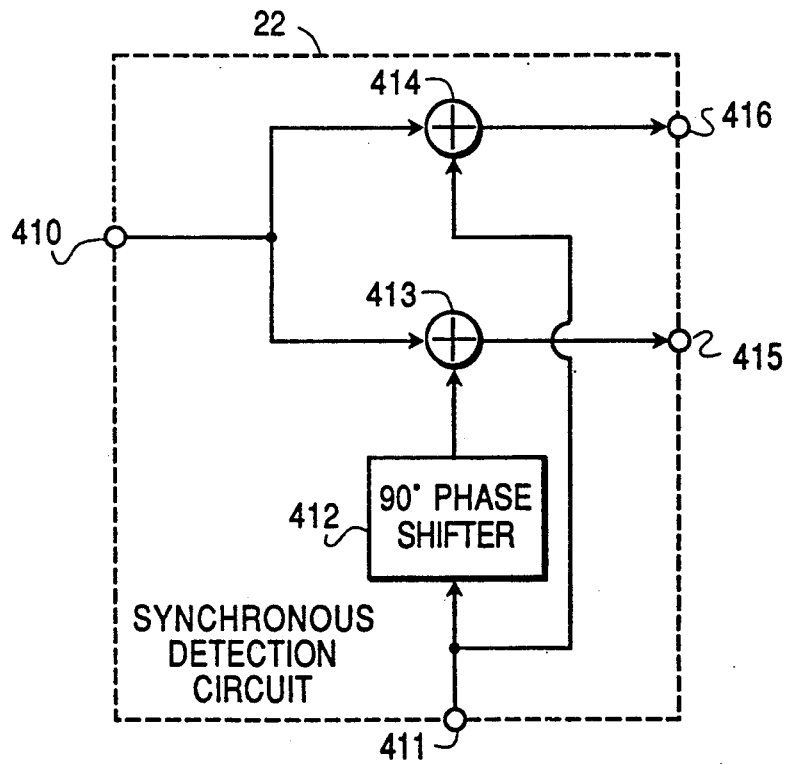
FIG. 4b is a block diagram of a synchronous detection circuit in the digital signal magnetic recording/reproducing apparatus of the present invention.

A synchronous detection circuit 22 in the demodulator 21 synchronously detects the reproduced signal from the equalizer circuit 19 using the carrier wave reproduced by the carrier wave reproducing circuit 20. A concrete block diagram of the synchronous detection circuit 22 is shown in FIG. 4b. The reproduced signal inputted through a terminal 410 is inputted into balanced modulators 413, 414. The carrier wave reproduced by the carrier wave reproducing circuit 20 is inputted through a terminal 411. The reproduced carrier is inputted into the balanced modulator 414, and on the other hand, after undergoing a 90° phase shift by a phase shifter 412, is inputted into the balanced modulator 413. The reproduced signal and the two carriers are respectively multiplied by the balanced modulators 413, 414, and outputted from terminals 416, 417 respectively as the output signals of the synchronous detection circuit 22.

The two channel demodulated signals outputted from the synchronous detection circuit 22 are inputted into LPFs 23 and 24, which pass only the multi-value base band signals. The characteristic of each LPF is so adjusted that the characteristic in combination of LPF 8 or 9 in the modulator with LPF 23 or 24 in the demodulator has a roll-off characteristic free from intersymbol interference. The output of LPFs 23 and 24 are fed to a decoder 27.

In the decoder 27, the outputs of LPFs 23 and 24 are fed to analog-digital converters (ADCs) 28 and 29 and converted to digital signals. The output of ADCs 28 and 29 are fed to a synchronous separation circuit 30 where the synchronous signal is removed to obtain a reproduced digital signal. The reproduced digital signal is outputted from an output terminal 31. Also, the reproduced clock signal is outputted from an output terminal 32.

The concrete embodiments of the synchronous addition circuit 4 and the synchronous separation circuit 30 are described in the U.S. patent application Ser. No. 329,720 filed on Mar. 28, 1989 by Shimotashiro et al, cited above, as "burst data insertion circuit" and "burst elimination circuit".

Figure 7A:
FIGS. 7a, 7b, 7c, 7d and 7e are conceptual diagrams each showing the waveform in recording of the digital signal magnetic recording/reproducing apparatus of the present invention.
Figure 7B:
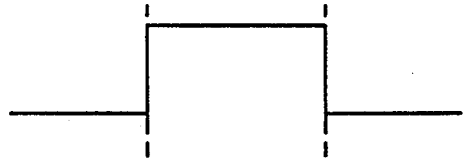
Figure 7C:
Figure 7D:
Figure 7E:
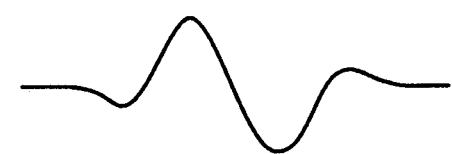

FIGS. 7a, 7b, 7c, 7d and 7e show the waveforms in recording. FIG. 7a shows the clock signal and FIG. 7b shows an example of the output of DAC 5 or 6. The output of DAC 5 or 6 is synchronized with the clock. FIG. 7c shows a band-restricted waveform of the signal in FIG. 7b. FIG. 7d shows a carrier wave to be used for modulation of the signal in FIG. 7c. The carrier wave in FIG. 7d has the same frequency as that of the clock in FIG. 7a and coincides with the clock in phase. FIG. 7e shows the modulated signal to be recorded which is the modulated waveform of the base band signal in FIG. 7c, using the carrier wave in FIG. 7d.

Figure 8A:
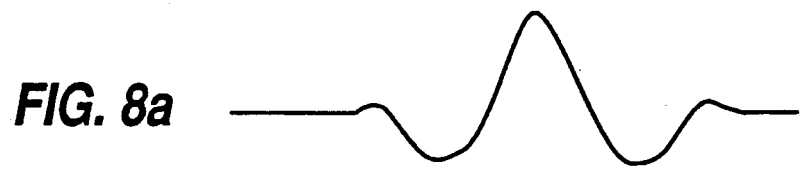
FIGS. 8a, 8b, 8c, 8d, 8e, 8f and 8g are conceptual diagrams each showing the wave form in reproducing of the digital signal magnetic recording/reproducing apparatus of the present invention.
Figure 8B:
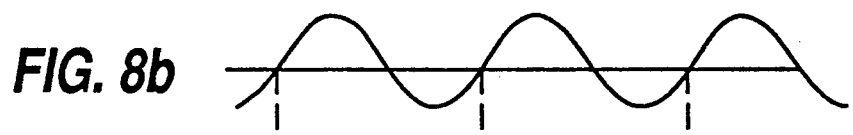
Figure 8C:

FIGS. 8a, 8b, 8c, 8d, 8e, 8f and 8g show the waveforms in reproducing. FIG. 8a shows a reproduced signal which is a reproduced waveform of the recorded signal in FIG. 7e. FIG. 8b shows a reproduced carrier wave outputted the carrier wave reproducing circuit 20. FIG. 8c shows a demodulated waveform of the signal in FIG. 8a, using the carrier wave in FIG. 8b.

Figure 8D:
Figure 8E:

If the reproduced clock has the same frequency as that of the reproduced carrier wave and coincides with the reproduced carrier in phase as in FIG. 8d, the output of ADC 28 or 29 will not be the correct waveform. In this case, the output of ADC is shown in FIG. 8e, in which the waveform of the recorded signal is shown by a broken line, sampled data of FIG. 8c by points, and the output of ADC by a solid line.

Figure 8F:
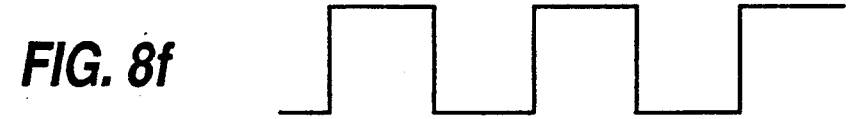
Figure 8G:

FIG. 8f shows the clock signal output of the clock phase shifter 26. The clock phase shifter 26 shifts the phase of the reproduced clock by a shift amount caused by the magnetic recording/reproducing process. As a result of such shift, the output of the ADC has a waveform shown in FIG. 8g, the same as that of the recorded signal in FIG. 7b.

As described above, according to the first embodiment, the carrier wave and clock can be reproduced using only one PLL. As such, the clock can be reproduced more quickly than the case where the carrier wave and clock are reproduced by two PLLs, respectively, free from the degradation of error rate caused by the phase shift between the carrier wave and the modulated signal.

Figure 9:
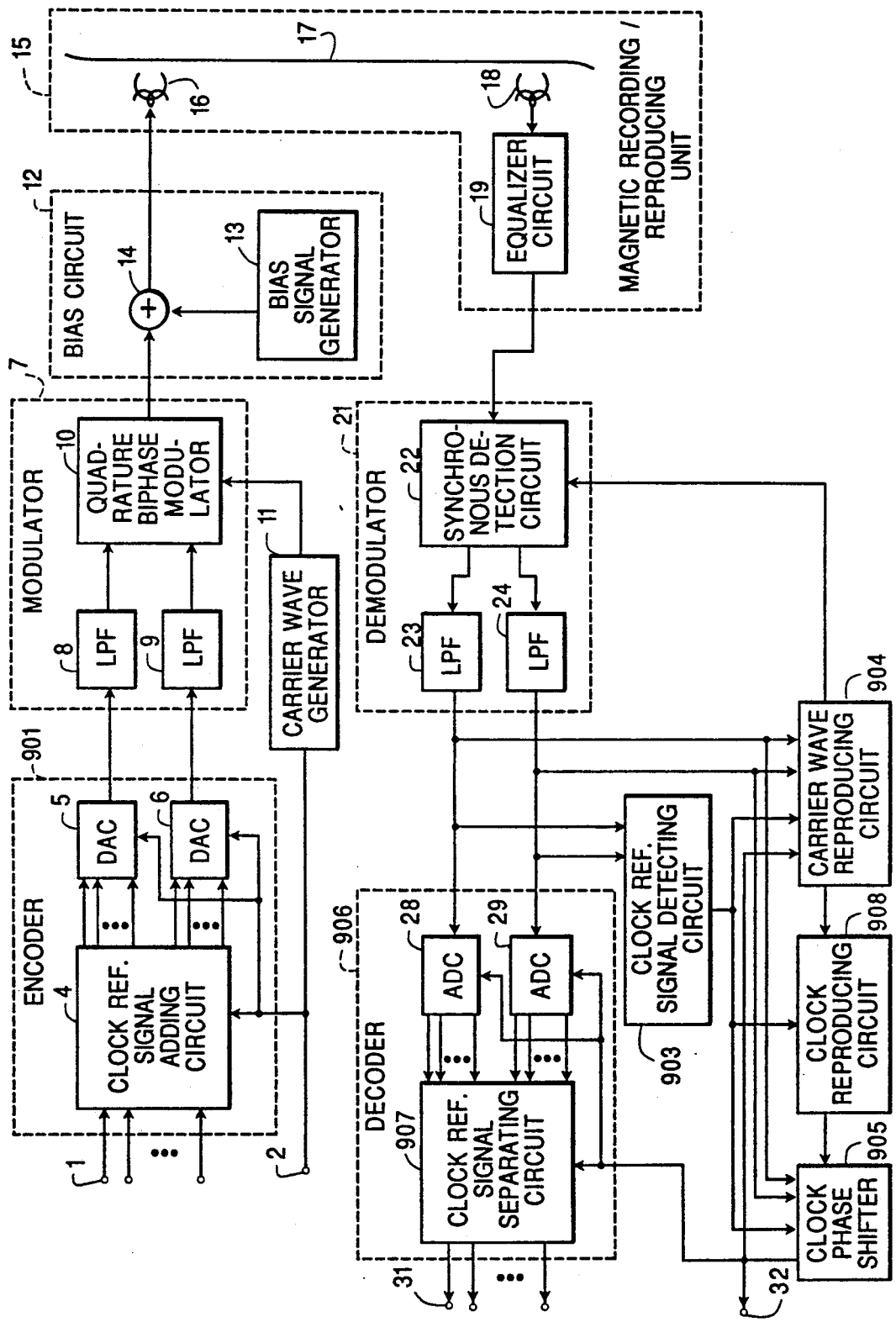
FIG. 9 is a block diagram of a digital signal magnetic recording/reproducing apparatus in the second embodiment of the present invention.

In FIG. 9 there is shown a block diagram of a digital signal magnetic recording/reproducing apparatus in the second embodiment of the present invention.

This embodiment differs from the first embodiment described above in that a clock reference signal is introduced. The second embodiment has a clock reference signal adding circuit 902, a clock reference signal detecting circuit 903, a clock phase shifter 905 and a clock reference signal separating circuit 907 to measure a phase shift between the carrier wave and the modulated signal caused by the magnetic recording/reproducing process, and a carrier wave reproducing circuit 904 and a clock reproducing circuit 908 to reproduce a carrier wave and a clock using the demodulated signal.

An digital signal is inputted into an encoder 901 through an input terminal 1. Also a clock signal is inputted into an input terminal 2. In the encoder 901, the inputted digital signal is added with a clock reference signal including a synchronous signal periodically for indicating a timing at which the carrier and clock signal coincide with each other in phase.

Figure 10A:
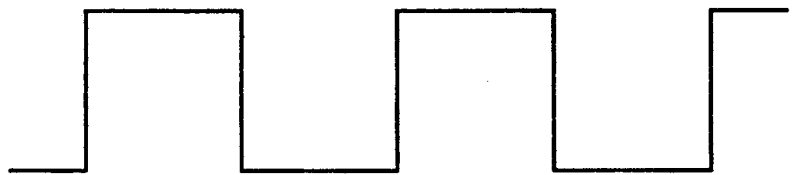
FIGS. 10a, 10b, 10c and 10d are conceptual diagrams showing the examples of the clock phase reference signal of the digital signal magnetic recording/reproducing apparatus in the second embodiment.
Figure 10B:
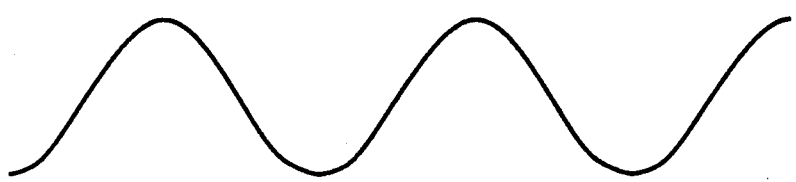
Figure 10C:
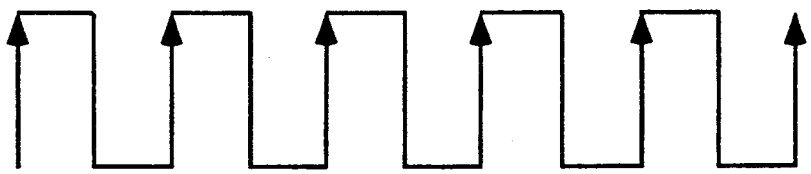
Figure 10D:
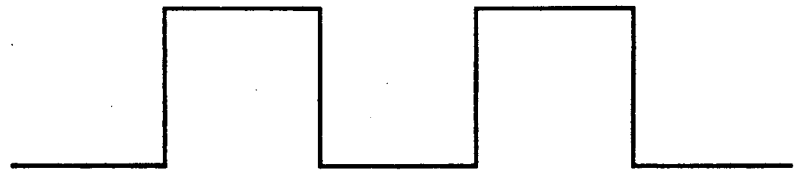

Also, the clock reference signal includes a waveform to measure a phase shift between the carrier wave and the modulated signal like the waveform in FIG. 10b, for example. FIG. 10b shows a frequency-restricted waveform of a multi-level digital signal in FIG. 10a which causes transition between two levels at clock intervals. This waveform is modulated and recorded on a magnetic recording medium. When the clock reference signal is reproduced and demodulated, the clock in the correct phase in FIG. 10c can sample the two levels like the waveform in FIG. 10d, the same as the multi-level digital signal in FIG. 10a. If the clock is in a wrong phase, the waveform of the sampled levels will have a smaller amplitude. To integrate the two levels respectively for some period can improve the accuracy of the adjustment of phase. The clock phase shifter 905 can set the clock phase as described above.

The digital signal added with the clock reference signal is divided into two parallel digital signals. These two parallel digital signals are applied to digital to analog converters (DACs) 5 and 6 respectively within the encoder 901, whereby each data value is converted to a multi-level digital signal.

The outputs of DAC 5 and 6 are inputted into a modulator 7. In the modulator 7, the output signals from DAC 5 and 6 are inputted into LPFs 8 and 9 respectively to undergo band restrictions. The outputs of LPFs 8 and 9 are inputted into a quadrature biphase modulator 10 and subjected to quadrature biphase modulation using a carrier outputted from a carrier wave generator 11.

The output from the quadrature biphase modulator 10 is inputted into a bias circuit 12, where it is added with a bias signal (frequency bias signal) outputted from a bias signal generator 13 by an adder 14, and the combined signal is outputted. The output of the bias circuit 12 is inputted to a magnetic recording/reproducing unit 14 and recorded on a magnetic recording medium 17 (e.g., a magnetic tape or a magnetic disc) by a recording head 16.

The signal recorded on the magnetic recording medium 17 is picked up by a reproducing head 18 (which may be the same as the recording head) and inputted into an equalizer circuit 19. An equalizer circuit 19 enhances high frequency components of the reproduced signal to compensate for attenuation of these components in the magnetic recording/reproducing process, to thereby render a flat overall frequency response characteristic for the magnetic recording/reproducing system (i.e. consisting of the heads 16, 18 and the medium 17). The equalized reproduced signal from the equalizer is then inputted to a demodulator 21.

The demodulator 21 and a carrier wave reproducing circuit 904 form the Costas loop circuit. A synchronous detection circuit 22 in the demodulator 21 synchronously detects the reproduced signal from the equalizer circuit 19 using the carrier wave reproduced by the carrier wave reproducing circuit 904.

The two channel demodulated signals outputted from the synchronous detection circuit 22 are inputted into LPFs 23 and 24, which pass only the multi-value base band signals. The characteristic of each LPF is so adjusted that the characteristic in combination of LPF 8 or 9 in the modulator with LPF 23 or 24 in the demodulator has a roll-off characteristic free from intersymbol interference. Outputs of LPFs 23 and 24 are fed to a decoder 27, a clock reference signal detecting circuit 903 and the carrier wave reproducing circuit 904. The clock reference signal detecting circuit 903 detects the timing when the clock reference signal is demodulated, and controls the operation of the carrier wave reproducing circuit 904, the clock reproducing circuit 908 and a clock phase shifter 905.

Figure 11:
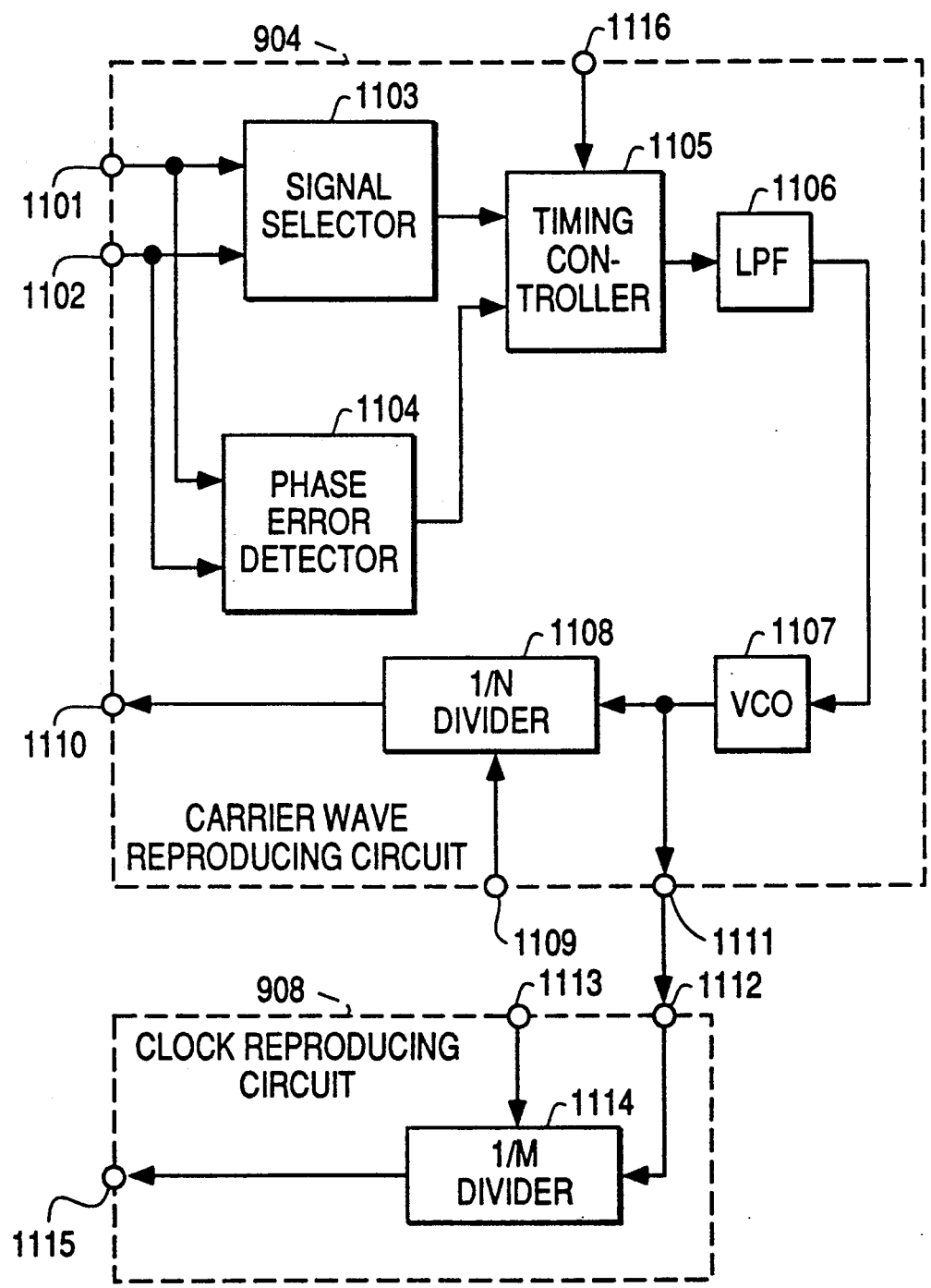
FIG. 11 is a block diagram of a carrier wave reproducing circuit and a clock reproducing circuit in the digital signal magnetic recording/reproducing apparatus in the second embodiment.

The carrier wave reproducing circuit 904 reproduces the carrier wave from the output signals of LPFs 23 and 24 using the Costas loop method. A concrete block diagram of the carrier wave reproducing circuit 904 and the clock reproducing circuit 908 is shown in FIG. 11. The demodulated signals are fed into a signal selector 1103 and a phase error detector 1103 through input terminals 1101 and 1102. The signal selector 1104 outputs a select signal which indicates the correct demodulated signal to detect the phase error. The phase error detector 1104 detects the phase error from the demodulated signal and outputs a phase error signal which varies in accordance with the phase error of the recovered carrier that is applied to the synchronous detection circuit 22. The timing controller 1105 outputs a VCO control signal from the phase error signal from the phase error detector 1104 using the select signal from the signal selector 1103. A phase-shifted clock outputted from the clock phase shifter 905 is fed to the timing controller 1105 through a terminal 1116. The output VCO control signal from the timing controller 1105 is fed to a VCO 1107 through a LPF 1106 to control the frequency of operation of the VCO 1107. The output signal from the VCO 1107 is frequency divided by a 1/N frequency divider 1108 and outputted through a terminal 1110 as a reproduced carrier.

On the other hand, the output from the VCO 1107 is fed also to a 1/M frequency divider 1114 in the clock reproducing circuit 908 through a terminal 1111 and 1112. The output of the 1/M divider is outputted through a terminal 1115 as a reproduced clock. The 1/N divider 1108 and the 1/M divider 1114 are reset by the timing signal from the clock reference signal detecting circuit 903. The operation of the Costas loop is more fully described in the U.S. patent application Ser. No. 329,720 filed on Mar. 28, 1989 by M. Shimotashiro et al cited above.

Figure 12:
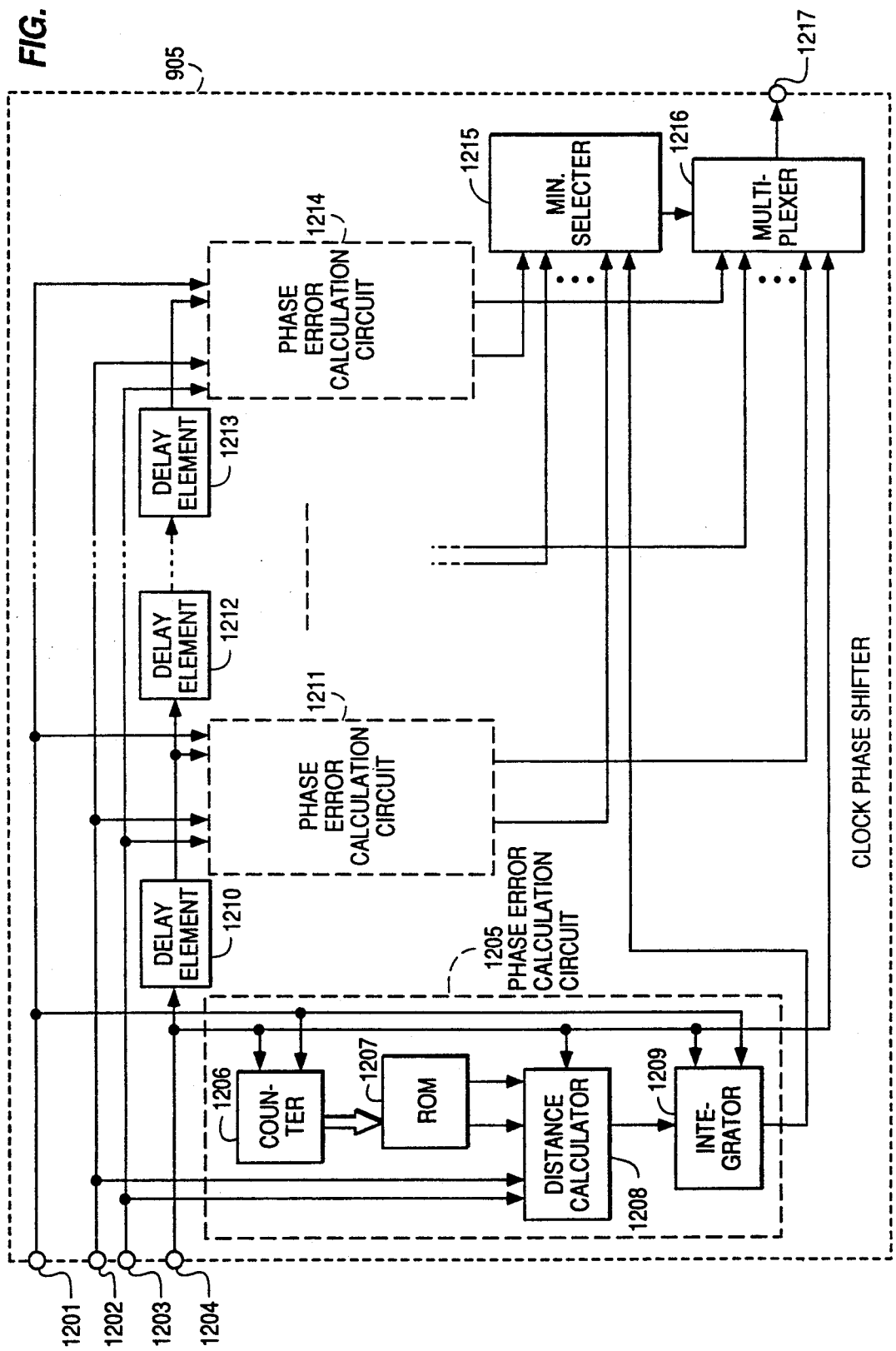
FIG. 12 is a block diagram of a clock phase shifter in the digital signal magnetic recording/reproducing apparatus in the second embodiment.

The clock phase shifter 905 shifts the phase of the output of the clock reproducing circuit 908 by a delay amount caused by the magnetic recording/reproducing process. A concrete block diagram of the clock phase shifter 905 is shown in FIG. 12. A timing signal from the clock reference signal detecting circuit 903 is inputted to a terminal 1201. Demodulated signals are inputted to terminals 1202 and 1203. The reproduced clock from the clock phase shifter 905 is inputted to a terminal 1204. The above four signals are fed to a phase error calculation circuit 1205. A counter 1206 generates an address to read out a waveform data in a ROM 1207 from the timing signal and the clock. The ROM 1207 outputs a waveform data of the clock reference signal. A distance calculator 1208 calculates a distance between the outputted waveform data from the ROM 1207 and the demodulated signal. An integrator 1209 integrates the distance to obtain a distance signal to improve the accuracy of the phase error calculation.

Phase error calculation circuits 1211 and 1214 each have the same structure as the phase error calculation circuit 1205, and there are a plurality of same phase error calculation circuits between 1211 and 1214. A timing signal from the terminal 1201 and the demodulated signals from the terminals 1202 and 1203 are inputted to each phase error calculation circuit. The reproduced clock from the terminal 1204 is inputted to phase error calculation circuit 1205, and to each of the subsequent phase error calculation circuits 1211–1214 after shifting its phase by each of delay elements 1210, 1212–1213. There are a plurality of delay elements between delay elements 1212 and 1213. Each of the phase error calculation circuits calculates the clock phase error as the distance signal for each phase shifted clock.

The distance signals are inputted to a minimum selector 1215 and the phase-shifted clocks are inputted to a multiplexer 1216. The minimum selector 1215 selects the minimum value of the distance signals and set the multiplexer 1216 output of the phase-shifted clock based on the phase error calculation circuit which outputs the minimum value of distance signal. The adjustment of the clock phase is achieved as described above.

The clock phase shifter 905 outputs the phase-shifted clock to a decoder 906 and an output terminal 32.

In the decoder 906, outputs of LPFs 23 and 24 are fed to analog-digital converters (ADCs) 28 and 29 and converted to digital signals. Outputs of ADCs 28 and 29 are fed to a clock reference signal separating circuit 907 where the clock reference signal is removed to obtain a reproduced digital signal. The reproduced digital signal is outputted from an output terminal 31. Also, the reproduced clock signal is outputted from an output terminal 32.

The clock reference signal adding circuit 902 and the clock reference signal separating circuit 907 are same in structure as the synchronous addition circuit 4 and the synchronous separation circuit 30, respectively. The difference is only in the signal forms of the synchronous signal and the clock reference signal.

As described above, according to the second embodiment, the carrier wave and clock can be reproduced using the Costas loop. This improves the accuracy of reproducing of the carrier wave and clock. Also, the phase-shift between the carrier wave and the clock is calculated from the reproduced signal. This improves the accuracy of clock phase adjusting.

Various changes and modifications may be made to the embodiments of the invention described hereinafter, which fall within the scope claimed for the invention. For example, it is possible to include an error correction code in the recording signal, using convolutional coding, by using a greater number of levels for the multi-level signals, and to use a Viterbi decoder upon playback to execute decoding of the playback multi-level signals.

Furthermore, although the invention has been described for the case of quadrature amplitude modulation being utilized to produce a recording signal, it is also possible to use other modulation methods such as amplitude phase shift keying (APSK), phase shift keying (PSK), frequency shift keying (FSK), etc, with comparable results being attainable.

What is claimed is:

1. A digital signal magnetic recording/reproducing apparatus comprising:
   carrier generating means for generating a carrier having a frequency (fc) which is related to a clock frequency (fck) of an inputted digital signal as $fck = (N/M) \cdot fc$, where each of N and M is a positive integer;
   modulation means for modulating the inputted digital signal using the carrier generated by the carrier generating means;
   magnetic recording/reproducing means for recording the modulated signal from the modulation means on a magnetic recording medium and reproducing the recorded signal;
   carrier wave reproducing means for reproducing the carrier from the reproduced signal from the magnetic recording/reproducing means;
   demodulating means for demodulating the reproduced signal from the magnetic recording/reproducing means by using the carrier reproduced by the carrier reproducing means;
   clock reproducing means for reproducing from the reproduced signal a clock having a frequency which is N/M times a frequency of the reproduced carrier;

clock phase shifting means for shifting the phase of the reproduced clock by the same amount as a phase shift between the carrier and the modulated signal caused by magnetic recording/reproducing process; and means for producing a reproduced digital signal from the demodulated signal from the demodulating means using the phase-shifted clock from the clock phase shifting means.

2. An apparatus according to claim 1, wherein said encoding means has synchronous addition means for adding a synchronous signal to the input digital signal and outputting an added result to the modulating means, and said carrier wave reproducing means produces a phase standard of the carrier wave in a period in which the synchronous signal is contained.

3. An apparatus according to claim 2, wherein said synchronous addition means produces as the synchronous signal a signal indicating the phase standard of the carrier wave.

4. An apparatus according to claim 1, wherein said encoding means has clock phase reference signal addition means for adding a clock phase reference signal to the input digital signal and outputting an added result output to the modulating means, and said clock phase shifting means produces a phase standard of the clock in a period in which the clock phase reference signal is contained.

5. An apparatus according to claim 4, wherein said clock phase reference signal addition means produces as the clock phase reference signal a signal indicating a phase standard of the clock.

6. An apparatus according to claim 1, wherein said carrier wave reproducing means reproduces the carrier from the demodulated signal from the demodulating means, instead of the reproduced signal from the magnetic recording/reproducing means.

7. An apparatus according to claim 1, further comprising bias means for adding a bias signal to the modulated signal before recording.

8. An apparatus according to claim 7, wherein the bias means comprises:

bias signal generating means for generating the bias signal for minimizing a non-linear distortion of the reproduced signal from the magnetic recording medium; and adding means for adding the bias signal to the modulated signal and outputting an added result to the magnetic recording/reproducing means.

9. An apparatus according to claim 8, wherein the bias signal generating means generates, at a frequency of at least three times a maximum frequency of a recording signal band, a bias signal having a current value that maximizes a total S/N ratio of a S/N ratio in the band and a S/N ratio when the power of a distortion remaining in the band is assumed noise.

10. A digital signal magnetic recording/reproducing apparatus comprising:

encoding means for converting an input digital signal into two-series multi-value digital signals;

carrier generating means for generating a carrier having a frequency (fc) which is related to a clock frequency (fck) of the input digital signal as fck=(N/M)·fc, where each of N and M is a positive integer;

modulation means for modulating the multi-value digital signals by quadrature biphase modulation using the carrier from the carrier generating means;

magnetic recording/reproducing means for recording the modulated signal from the modulation means on a magnetic recording medium and reproducing the recorded signal;

carrier wave reproducing means for reproducing the carrier from the reproduced signal from the magnetic recording/reproducing means;

demodulating means for demodulating the reproduced signal from the magnetic recording/reproducing means into two series multi-level demodulated signals by using the carrier reproduced by the carrier reproducing means;

clock reproducing means for reproducing from the reproduced signal a clock having a frequency which is N/M times a frequency of the reproduced carrier;

clock phase shifting means for shifting the phase of the reproduced clock by the same amount as a phase shift between the carrier and the modulated signal caused by magnetic recording/reproducing process; and decoding means for decoding the demodulated signal from the demodulating means into a reproduced digital signal using the phase-shifted clock from the clock phase shifting means.

11. An apparatus according to claim 10, wherein said encoding means has synchronous addition means for adding a synchronous signal to the input digital signal and outputting an added result to the modulating means, and said carrier wave reproducing means produces a phase standard of the carrier wave in a period in which the synchronous signal is contained.

12. An apparatus according to claim 11, wherein said synchronous addition means produces as the synchronous signal a signal indicating the phase standard of the carrier wave.

13. An apparatus according to claim 10, wherein said encoding means has clock phase reference signal addition means for adding a clock phase reference signal to the input digital signal and outputting an added result to the modulation means, and said clock phase shifting means produces a phase standard of the clock in a period in which the clock phase reference signal is contained.

14. An apparatus according to claim 13, wherein said clock phase reference signal addition means produces as the clock phase reference signal a signal indicating the phase standard of the clock.

15. An apparatus according to claim 10, wherein said carrier wave reproducing means reproduces the carrier from the demodulated signal from the demodulating means, instead of the reproduced signal from the magnetic recording/reproducing means.

16. An apparatus according to claim 10, further comprising bias means for adding a bias signal to the modulated signal before recording.

17. An apparatus according to claim 16, wherein the bias means comprises:

bias signal generating means for generating the bias signal for minimizing a non-linear distortion of the reproduced signal from the magnetic recording medium; and adding means for adding the bias signal to the modulated signal and outputting an added result to the magnetic recording/reproducing means.

18. An apparatus according to claim 17, wherein the bias signal generating means generates, at a frequency of at least three times a maximum frequency of a recording signal band, a bias signal having a current value that maximizes a total S/N ratio of a S/N ratio in the band and a S/N ratio when the power of a distortion remaining in the band is assumed noise.

* * * * *